US006246632B1

(12) United States Patent
Seyyedy et al.

(10) Patent No.: US 6,246,632 B1
(45) Date of Patent: Jun. 12, 2001

(54) COLUMN DECODE CIRCUITS AND APPARATUS

(75) Inventors: Mirmajid Seyyedy; Jeffrey P. Wright, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/677,364

(22) Filed: Oct. 2, 2000

Related U.S. Application Data

(63) Continuation of application No. 09/374,944, filed on Aug. 16, 1999, which is a continuation of application No. 09/109,607, filed on Jul. 2, 1998, now Pat. No. 5,978,309, which is a continuation of application No. 08/915,853, filed on Aug. 21, 1997, now Pat. No. 5,835,441.

(51) Int. Cl.[7] ..................................................... G11C 8/00
(52) U.S. Cl. .............................. 365/230.06; 365/189.05; 365/230.08
(58) Field of Search ........................ 365/230.06, 189.05, 365/230.08

(56) References Cited

U.S. PATENT DOCUMENTS

| | | | |
|---|---|---|---|
| 4,858,190 | 8/1989 | Yamaguchi et al. | 365/189.05 |
| 5,124,951 | 6/1992 | Slemmer et al. | 365/230.06 |
| 5,128,897 | 7/1992 | McClure | 365/230.06 |
| 5,136,546 | 8/1992 | Fukuda et al. | 365/230.03 |
| 5,526,318 | 6/1996 | Slemmer et al. | 365/226 |
| 5,587,961 | 12/1996 | Wright et al. | 365/233 |
| 5,598,375 | 1/1997 | Yang et al. | 365/230.06 |
| 5,604,714 | 2/1997 | Manning et al. | 365/230.08 |
| 5,615,164 | 3/1997 | Kirihata et al. | 365/230.06 |
| 5,627,791 | 5/1997 | Wright et al. | 365/222 |
| 5,636,175 | 6/1997 | McLaury | 365/230.06 |
| 5,640,351 | 6/1997 | Yabe et al. | 365/189.04 |
| 5,650,976 | 7/1997 | McLaury | 365/230.06 |
| 5,706,229 | 1/1998 | Yabe et al. | 365/189.05 |
| 5,729,502 | 3/1998 | Furutani et al. | 365/233 |
| 5,835,441 * | 11/1998 | Seyyedy et al. | 365/230.06 |
| 5,848,024 * | 12/1998 | Cho | 365/230.08 |
| 5,978,309 * | 11/1999 | Seyyedy et al. | 365/230.06 |
| 6,064,622 * | 11/1999 | May | 365/230.06 |
| 6,088,293 * | 7/2000 | Ho | 365/233 |

OTHER PUBLICATIONS

Fujiwara, et al., "A 200MHz 16Mbit Synchronous DRAM with Block Access Mode", 1994 Symposium on VLSI Circuits—Digest of Technical Papers, 79–80, (Jun. 9–11, 1994).

Nitta, Y., et al., "A 1.6GB/s Data–Rate 1Gb Synchronous DRAM with Hierarchical Square–Shaped Memory Block and Distributed Bank Architecture", IEEE International Solid–State Circuits Conf., 376–377, (Feb. 1996).

Takai, et al., "250 Mbyte/sec Synchronous DRAM Using a 3–Stage–Pipelined Architecture", 1993 Symposium on VLSI Circuits—Digest of Technical Papers, 59–60, (May 19–21, 1993).

Yoo, J., et al., "A 32–Bank 1Gb DRAM with 1GB/s Bandwidth", IEEE International Solid–State Circuits Conf., 378–379, (Feb. 1996).

* cited by examiner

*Primary Examiner*—Richard Elms
*Assistant Examiner*—Tuan T. Nguyen
(74) *Attorney, Agent, or Firm*—Schwegman, Lundberg, Woessner & Kluth, P.A.

(57) ABSTRACT

A synchronous memory device is described which uses unique column select circuitry. The memory device pipelines address decode and column select operation to increase clock frequency. The column select circuitry includes latches and coupling circuits. The latches are used to latch a column select circuit. The coupling circuit isolates a column select signal from the memory cell columns until an enable signal is provided. The address decode can be combined with an enable signal to reduce the total number of latch circuits needed for a bank of memory cells.

15 Claims, 5 Drawing Sheets

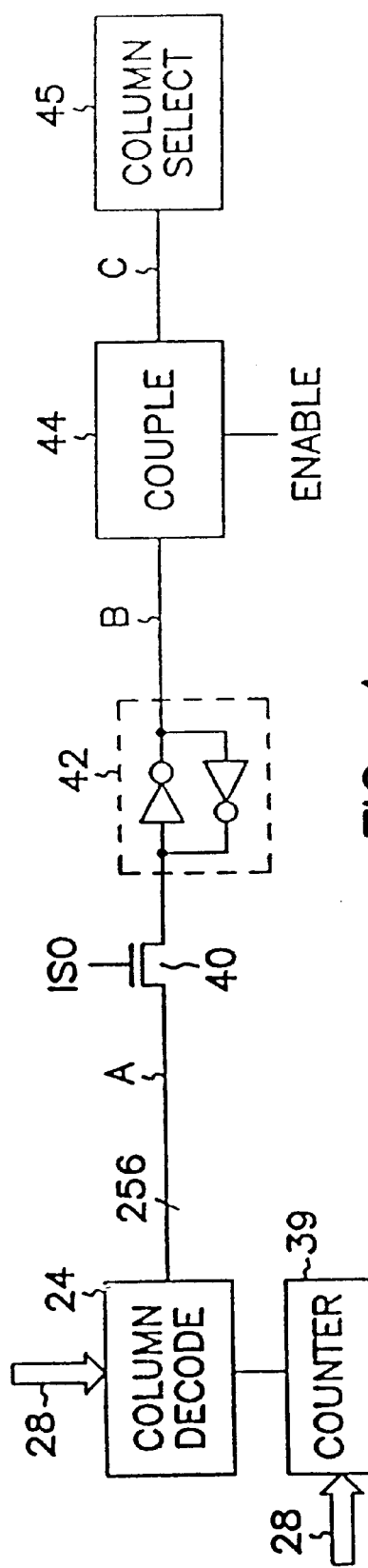
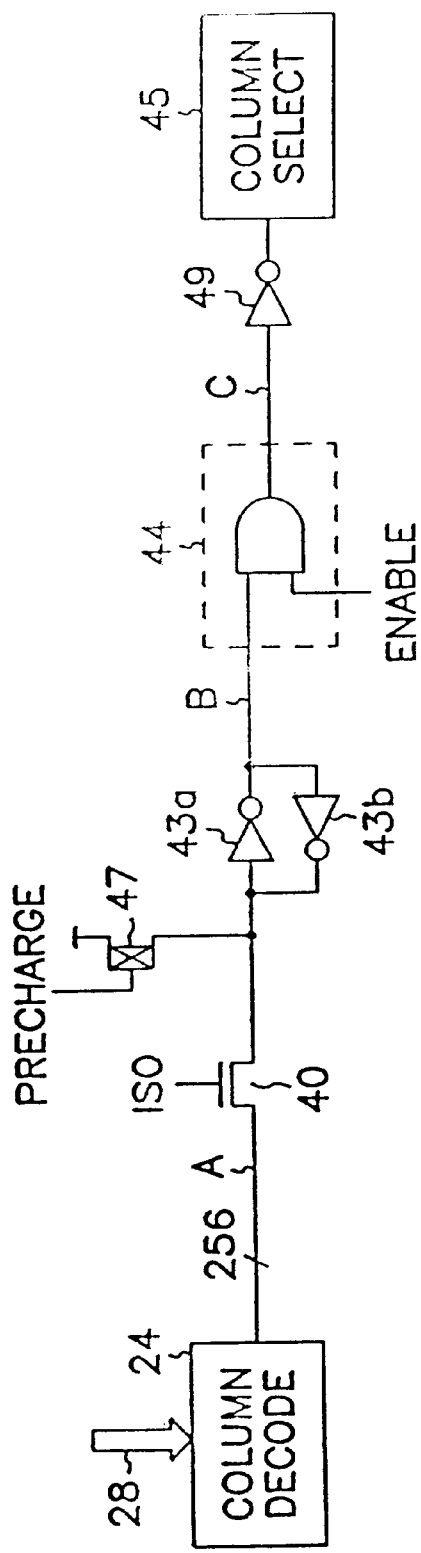

COLUMN DECODE CIRCUITS AND APPARATUS

This application is a continuation of U.S. Ser. No. 09/374,944, filed on Aug. 16, 1999 which is a continuation of U.S. Ser. No. 09/109,607 filed Jul. 2, 1998, now U.S. Pat. No. 5,978,309 which is a continuation of U.S. Ser. No. 08/915,853 filed Aug. 21, 1997, now U.S. Pat. No. 5,835,441.

TECHNICAL FIELD OF THE INVENTION

The present invention relates generally to synchronous memory devices and in particular the present invention relates to memory array access signals.

BACKGROUND OF THE INVENTION

Synchronous dynamic random access memory (SDRAM) devices operate by accessing memory cells in synchronization with a clock signal. The access speed of the device is therefore F; dependant upon the frequency of the clock. An increase in the clock frequency, therefore, will increase access speed. A problem is experienced when the clock frequency exceeds the process speed of internal memory cell access operations. For example, to access a column of a memory array, an address signal is decoded and column select circuitry is activated. A problem is experienced when the clock frequency exceeds the time needed to complete an access operation of a previous memory column. Thus, if an access is not completed prior to decoding a new column address, the currently accessed column may be prematurely closed.

To avoid some of the timing problems experienced in SDRAMs, the column address decode operation can be pipeline. Additionally, a column select latch can be used to lath a currently accessed memory column while the address of a new column is concurrently decoded, see 250 Mbyte/sec Synchronous DRAM Using a 3-Stage-Pipelined Architectue, Takai et al., 1993 *Symposium on VLSI Circuits—Digest of Technical Papers*, pages 59–60 (May 19–21, 1993) incorporated herein by reference. The problem with this type of column decode and select circuitry is that a column is selected when a new select signal is latched. Thus, a new address must either be delayed from being latched until a current column access operation is completed, or slower clock frequencies must be used. Further, Takai et al. describes an SDRAM which uses a latch connected between a column decode circuit and the memory array. Thus, 256 latch circuits are required in a memory having eight address lines.

For the reasons stated above, and for other reasons stated below which will become apparent to those skilled in the art upon reading and understanding the present specification, there is a need in the art for a SDRAM having a pipelined address decode which can efficiently delay a new column address until a current access operation is completed. Such a memory device will allow the use of higher clock frequencies.

SUMMARY OF THE INVENTION

The above mentioned problems with synchronous memory devices and other problems are addressed by the present invention and which will be understood by reading and studying the following specification. A synchronous memory is described which latches a decoded column select signal. The memory further provides an enable control for coupling the column select signal to a column of memory. In particular, the present invention describes a synchronous memory device comprising a memory array of memory cells, the memory cells being arranged in addressable rows and columns, and address inputs for receiving a plurality of address signals. A column decode circuit is provided for decoding the plurality of address inputs and producing an output signal identifying a column of the memory array. A latch circuit is coupled to the column decode circuit for latching the output signal. A coupling circuit is electrically located between the latch circuit and a column select circuit. The coupling circuit electrically isolating the latch circuit from the column select circuit in response to an enable signal.

In an alternate embodiment, a synchronous memory device comprises a memory array of memory cells, the memory cells being arranged in addressable rows and columns, and address inputs for receiving a plurality of address signals. A first column decode circuit is provided for decoding some of the plurality of address inputs and producing a first output signal. A latch circuit is coupled to the first column decode circuit for latching the first output signal. A second column decode circuit for decoding some of the plurality of address inputs, and an enable circuit is coupled to the second column decode circuit and an enable signal, the enable circuit producing a second output signal. A coupling circuit is electrically located between the latch circuit and a column select circuit. The coupling circuit electrically isolating the latch circuit from the column select circuit in response to the second output signal.

In another embodiment, a method of selecting a column of memory cells in a synchronous memory device is described. The method comprises the steps of receiving a plurality of address signals on address input lines, and decoding the plurality of address signals to identify a column of memory cells. A column select signal is produced in response to the decoded plurality of address signals. The column select signal is latched, and coupled to a column select circuit in response to an enable signal.

In yet another embodiment, a method of selecting a column of memory cells in a synchronous memory device is described. The method comprises the steps of receiving a plurality of address signals on address input lines, and decoding some of the plurality of address signals to produce a first decoded signal. Additional ones of the plurality of address signals are decoded to produce a second decoded signal;. The first decoded signal is latched, and a column select signal is produced in response to the first decoded signal, the second decoded signal, and an enable signal.

BRIEF DESCRIPTION OF THE DRAWINGS

FIG. 4 is a schematic diagram of an address column decode circuit of the present invention;

FIG. 5 is a schematic diagram of another address column decode circuit of the present invention;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
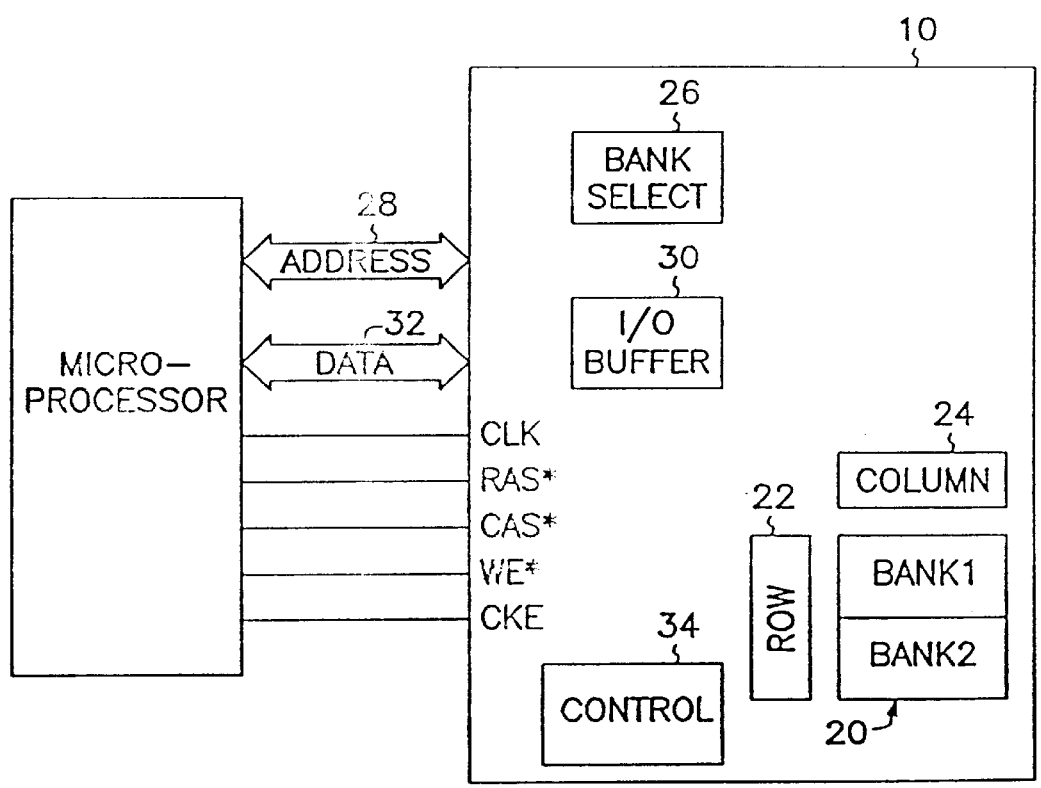
FIG. 1 is a block diagram of a SDRAM of the present invention.

A typical SDRAM 10 is illustrated in FIG. 1. The memory has an array 20 of dynamic memory cells arranged in two banks. The memory cells are accessed in response to an address 0 signal provided on address lines 28 using row 22 and column 24 decode circuitry. A bank select circuit 26 is used to select one of the two array banks in response to an address provided on address lines 28. Input/output buffers 30 are provided for bi-directional data communication via data communication lines 32. Control circuitry 32 regulates the SDRAM operations in response to control signals which include, but are not limited to, a Clock (CLK), Row Access Strobe (RAS*), Column Access Strobe (CAS*), Write Enable (WE*), and Clock Enable (CKE). An external processor is provided for both bi-directional data communication and control with the memory.

Figure 2:
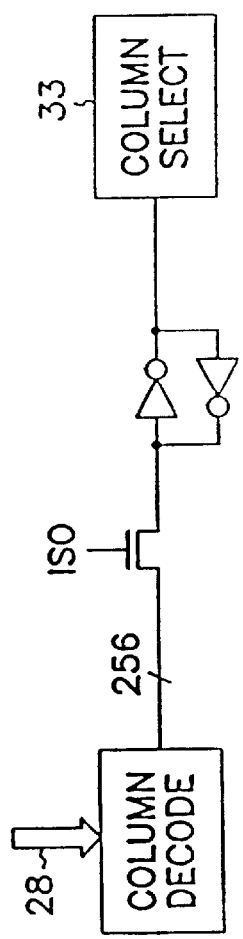
FIG. 2 is a block diagram of a decoding circuit.

FIG. 2 is a block diagram of typical decoding circuitry used to decode a column address of a memory array. In operation, an address provided on address lines 28 is decoded by column decode circuitry, latched, and used to activate column select circuit 33 (isolation transistors) which in turn activates a column of the memory array. In a memory having a 256×4 memory array, the decode circuitry is used to access one of 256 memory array columns. Thus, a total of 256 latches and column select signals are required to individually access all of the memory columns. Further, a new column is immediately accessed when a new column address is latched.

Figure 3:
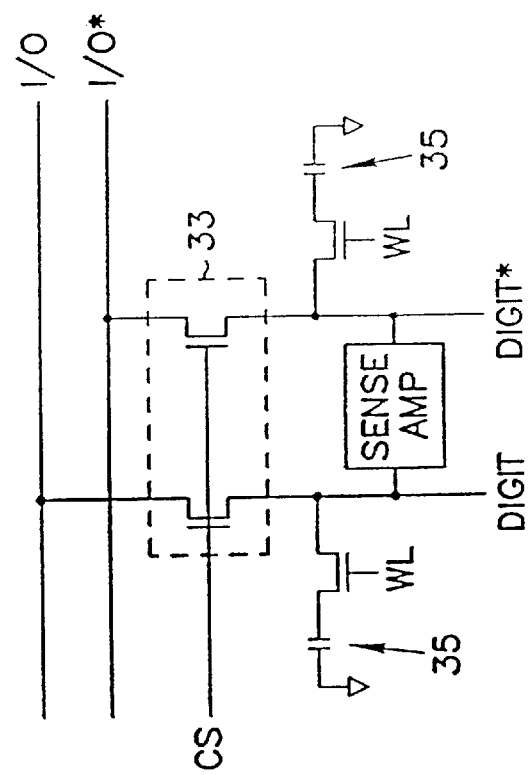
FIG. 3 shows a pair of input/output lines and digit lines.

FIG. 3 generally illustrates a pair of I/O lines which can be selectively connected to a digit line pair by column select circuitry 33. The digit line pair, as known to those skilled in the art, is coupled to memory cells 35 and sense amplifier circuitry. During a read or write operation data is communicated internally over the I/O communication line pairs which are coupled to an accessed memory column. These lines typically carry complimentary signals. To minimize communication timing, therefore, the I/O lines are equilibrated to a predetermined voltage level.

Referring to FIG. 4, one embodiment of address column decode circuitry of memory 10 is illustrated. Column decode circuitry 24 decodes address signals provided on external address lines 28. The decoded address is then coupled to latch circuit 42 via isolation switch 40. The signal provided at Node A is one of 256 possible outputs of the column decode circuit, assuming a 256 column memory array. A coupling circuit 44 and column select circuit 45 are provided to connect an addressed column of the memory array to complementary input/output (I/O) data lines, as described above. During a read operation, signals provided on the I/O data lines are latched by buffer circuit 30 for output on DQ lines 32, see FIG. 1. During a write operation, data provided on the DQ lines 32 is latched in buffer circuit 30.

An Enable signal is used to activate the coupling circuit 44. The coupling circuit 44 can be an AND logic gate as illustrated in FIG. 5 where one of the AND inputs is a signal latched by latch circuit 42 (Node B) and the second input is an Enable signal having active and inactive states. The output of the coupling circuit (Node C), therefore, is held constant while the Enable signal is inactive. Latch circuit 42 includes a feedforward inverter 43a and a feedback inverter 43b. The feedback inverter is preferably fabricated as a long-L device so that the feedforward inverter is tripped easier. A precharge transistor 47 is included to set the latch input at a high state. The precharge transistor and long-L design can be included in any of the circuits described in FIGS. 4 and 7. The output signal of inverter 49 is coupled to an isolation transistor of an input/output communication line.

Figure 6:
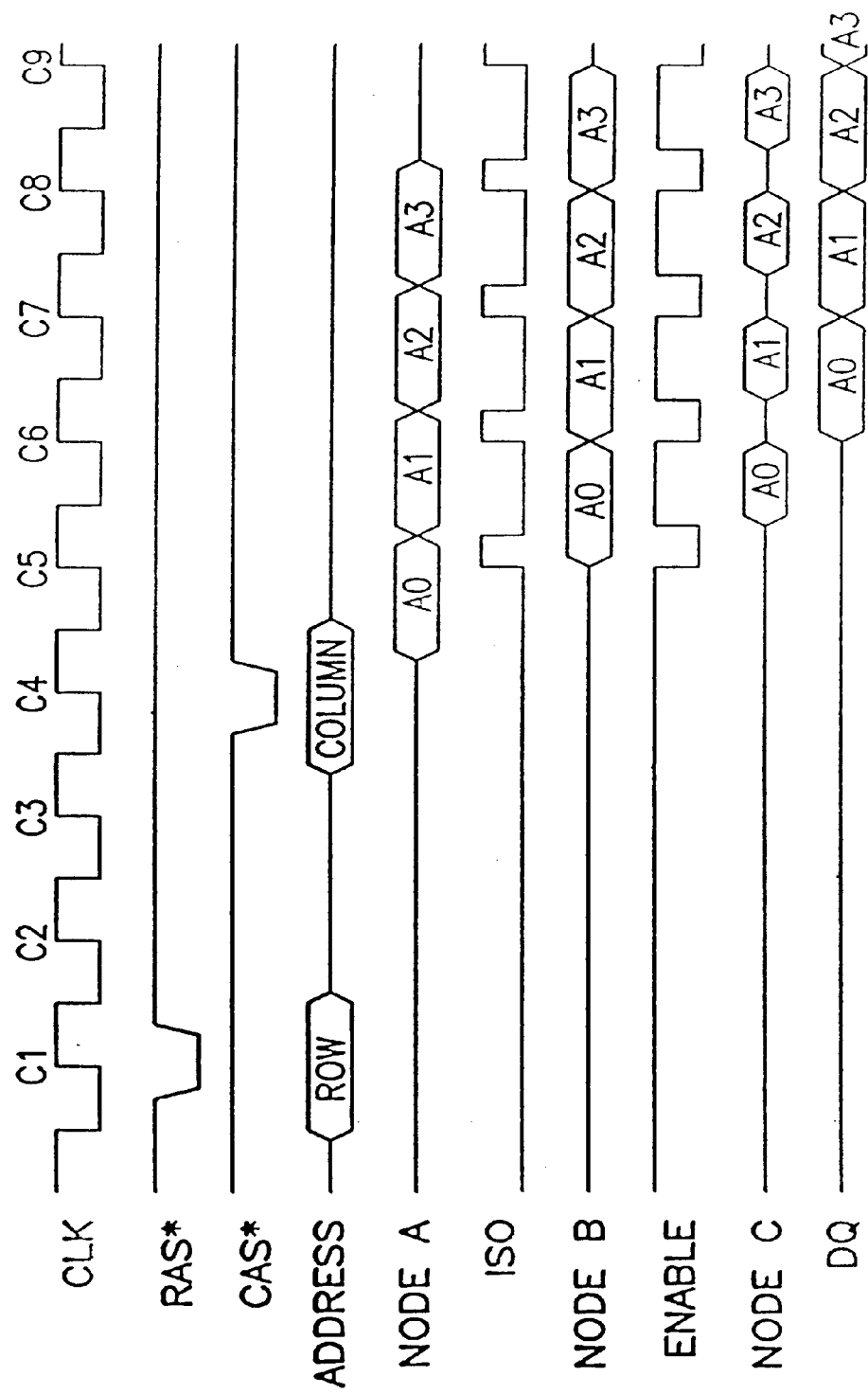
FIG. 6 is a timing diagram of a pipelined read operation.

FIG. 6 illustrates a timing diagram of a burst read operation of the memory circuit of FIGS. 1 and 4 having a clock latency of 3. It will be appreciated that many different read operations can be performed and that the specific read operation of FIG. 5 is provided to help illustrate the present invention. On a first active edge of the clock signal (C1) a row address is latched and a row of the memory array is accessed in response to both an active RAS* signal and address signals provided on the address lines 28. After a minimum RAS* to CAS* delay, CAS* transitions low and on the fourth clock high transition (C4) a column address is latched and decoded by column decode circuitry 24. It will be appreciated that a column address signal will "ripple" through the column decode circuit and provide an appropriate signal at one of a plurality of outputs, for example 256 outputs in a 256 column memory. One of the outputs is illustrated and labeled Node A in FIG. 4. The isolation switch 40 is open, or inactive, while the column address is being decoded. On the next clock signal (C5), the isolation switch is activated and the signal on Node A is latched at Node B by latch circuit 42. While the isolation switch is activated, the coupling circuit 44 is turned off using the Enable signal such that Nodes B and C are electrically isolated. Using the circuit of FIG. 5, Node C is pulled low by the coupling circuit 44 so that all columns of the memory array are deactivated. This deactivation period is an ideal time for equilibrating the I/O lines to a predetermined voltage prior to accessing a new column of the array.

After the I/O lines have been equilibrated and the decoded column signal latched at Node B. The Enable signal transitions to an active state to couple Node B to Node C. Data stored in the addressed memory column is connected to the I/O lines and latched by buffer circuit 30. The data is then output on DQ lines 32 at clock signal C6. While the data from column address A0 is being latched at Node B in response to clock signal C5, a new column address provided by the burst counter 39 is rippling through column decoder 24. This new column address is ultimately latched by latch 42 and coupled to Node C as explained above. A column address, therefore, is decoded, latched and coupled to column select circuitry in three steps. Thus, the column address is pipelined to allow faster clock frequencies and a new column is not accessed until a previous column read/write operation is completed. Further, while the new address is being latched the data I/O lines can be equilibrated to increase the speed of data transfer over the I/O lines.

Figure 7:
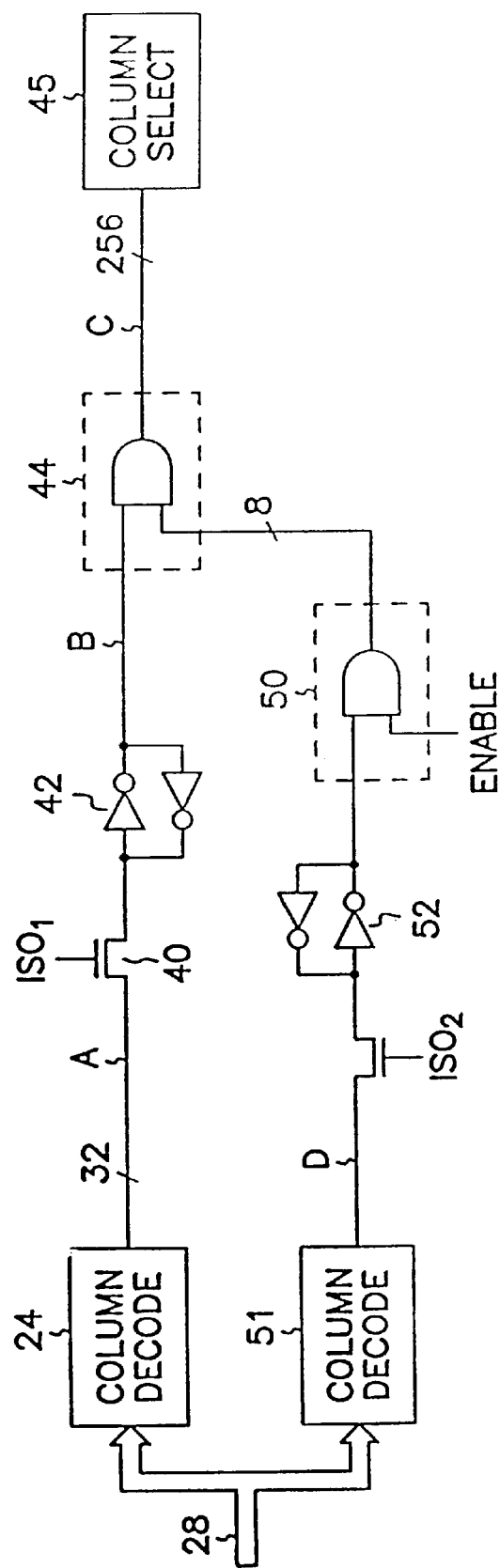
FIG. 7 is a schematic diagram of another address column decode circuit of the present invention.

In an alternate embodiment, the column decide circuitry 24 is separated in a hierarchical manner such that a complete column decode is not latched by latch circuit 42. That is, for a memory having 256 columns (8 address lines) five of the external address lines are used to provide one of 32 possible addresses, as illustrated in FIG. 7. Thirty-two isolation devices 40 and latches 42 are provided as described above for latching the decoded signal. A coupling circuit 44 is provided which uses an Enable signal and the remaining address lines in combination to enable one of 256 possible column select signals (Node C). The coupling circuit 44 includes logic circuitry, such as an AND gate which has a first input from Node B and a second signal provided from an Enable circuit 50. The Enable circuit 50 includes logic circuitry such as an AND gate having one input connected to receive an Enable signal and a second input provided by a second column decode circuit 51. The output of the second column decoder can be connected to latch 52 via an isolation transistor operative with an $ISO_2$ signal. Thus, by combining a second column decode with the Enable signal the number of latches needed for the memory is reduced from 256 to approximately 40. This hierarchical column decode structure has the benefit of reducing die area required for column decoding which is critical in high density memory devices.

The present invention can be used in a memory device having any number of columns, and is not intended to be limited to a specific number of columns. Further, it will be appreciated that a pipelined write operation can be performed in a memory device incorporating the present invention. The address decoding and latching during a write operation, therefore, will be similar to the pipelined read operation described above with reference to FIG. 6.

Conclusion

A synchronous memory device has been described which has memory cells arranged in rows and columns. The memory decodes an external address and accesses a column of memory cells in a pipelined manner. A latch circuit is provided for latching either a column select signal or a partially decoded address. A coupling circuit is provided for activating a column select circuit in response to an Enable signal. That is, in one embodiment described the external address of a new memory column is decoded and a column select signal is latched. The new column is not accessed until the coupling circuit is activated by the Enable signal. Alternatively, an external address of a new memory column is partially decoded and latched. An Enable signal and the remaining address decode are combined to activate the coupling, thereby accessing the new memory column.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An address column decode circuit, comprising:
   a logic circuit interposed between a select circuit and a latch circuit;
   wherein the select circuit is adapted to select a column of a memory array in response to a decode signal latched in the latch circuit; and
   wherein the logic circuit selectively provides the decode signal to the select circuit in response to an enable signal.

2. The address column decode circuit of claim 1, wherein the logic circuit has the enable signal as a first input and the decode signal as a second input, further wherein the logic circuit has an output for selectively providing the decode signal to the select circuit in response to the enable signal.

3. An address column decode circuit, comprising:
   an AND logic gate interposed between a select circuit and a latch circuit;
   wherein the select circuit is adapted to select a column of a memory array in response to a decode signal latched in the latch circuit; and
   wherein the AND logic gate has the decode signal as a first input and an enable signal as a second input to selectively provide the decode signal to the select circuit in response to the enable signal being in a high logic state.

4. An address column decode circuit, comprising:
   a logic circuit interposed between a select circuit and a latch circuit;
   wherein the select circuit is adapted to select a column of a memory array in response to a plurality of decode signals latched in the latch circuit; and
   wherein the logic circuit selectively provides the plurality of decode signals to the select circuit in response to an enable signal.

5. The address column decode circuit of claim 4, wherein the logic circuit has the enable signal as a first input and the plurality of decode signals as second inputs, further wherein the logic circuit has an output for selectively providing the plurality of decode signals to the select circuit in response to the enable signal.

6. An address column decode circuit, comprising:
   a plurality of AND logic gates interposed between a select circuit and a latch circuit;
   wherein the select circuit is adapted to select a column of a memory array in response to a plurality of decode signals latched in the latch circuit; and
   wherein each of the plurality of AND logic gates has one of the plurality of decode signals as a first input and an enable signal as a second input to selectively provide each of the plurality of decode signals to the select circuit in response to the enable signal being in a high logic state.

7. A memory device, comprising:
   a memory array having a plurality of memory cells, wherein the plurality of memory cells are arranged in addressable portions;
   an addressing decode circuit, wherein the addressing decode circuit produces a plurality of decode signals in response to an address signal;
   a latch circuit coupled to the addressing decode circuit, wherein the latch circuit latches the plurality of decode signals and produces a plurality of select signals;
   a select circuit, wherein the select circuit activates a portion of the memory array in response to the plurality of select signals; and
   an enable circuit coupled between the addressing decode circuit and the select circuit, wherein the enable circuit selectively isolates the plurality of select signals from the select circuit in response to an enable signal.

8. An address column decode circuit, comprising:
   a column decode circuit, wherein the column decode circuit provides an decode signal in response to an address signal;
   a latch circuit, wherein the latch circuit provides a column select signal;
   an isolation switch interposed between the column decode circuit and the latch circuit and responsive to a first control signal to couple the column decode circuit to the latch circuit, wherein coupling the column decode circuit to the latch circuit latches the decode signal into the latch circuit and produces the column select signal;

a column select circuit capable of selecting a column of a memory array in response to the column select signal; and a coupling circuit interposed between the latch circuit and the column select circuit, wherein the coupling circuit is capable of selectively providing the column select signal to the column select circuit.

9. An address column decode circuit, comprising:

a column decode circuit, wherein the column decode circuit provides at least one decode signal in response to an address signal;

a latch circuit, wherein the latch circuit provides at least one latched output;

at least one isolation switch interposed between the column decode circuit and the latch circuit and responsive to a first control signal to couple the column decode circuit to the latch circuit, wherein coupling the column decode circuit to the latch circuit latches the at least one decode signal into the latch circuit and produces the at least one latched output;

a column select circuit capable of selecting a column of a memory array in response to the at least one latched output; and a coupling circuit interposed between the latch circuit and the column select circuit, wherein the coupling circuit is capable of selectively providing the at least one latched output to the column select circuit.

10. The address column decode circuit of claim 9, wherein the coupling circuit comprises a logic circuit having an enable signal as a first input and the at least one latched output as a second input, further wherein the logic circuit has an output for selectively providing the at least one latched output to the column select circuit in response to the enable signal.

11. An address column decode circuit, comprising:

a column decode circuit, wherein the column decode circuit provides at least one decode signal in response to an address signal;

a latch circuit, wherein the latch circuit provides at least one latched output;

at least one isolation switch interposed between the column decode circuit and the latch circuit and responsive to a first control signal to couple the column decode circuit to the latch circuit, wherein coupling the column decode circuit to the latch circuit latches the at least one decode signal into the latch circuit and produces the at least one latched output;

a column select circuit capable of selecting a column of a memory array in response to the at least one latched output; and a coupling circuit coupled between the latch circuit and the column select circuit, wherein the coupling circuit comprises a logic circuit having an enable signal as a first input and the at least one latched output as a second input, further wherein the logic circuit has an output for selectively providing the at least one latched output to the column select circuit in response to the enable signal.

12. An address column decode circuit, comprising:

a latch circuit;

a select circuit adapted to select a column of a memory array in response to a decode signal latched in the latch circuit; and a logic circuit interposed between the select circuit and the latch circuit, wherein the logic circuit has the enable signal as a first input and the decode signal as a second input, further wherein the logic circuit electrically isolates the decode signal from the select circuit in response to the enable signal.

13. An address column decode circuit, comprising:

a latch circuit;

a select circuit adapted to select a column of a memory array in response to a decode signal latched in the latch circuit; and an AND logic circuit interposed between the select circuit and the latch circuit, wherein the logic circuit has the enable signal as a first input and the decode signal as a second input, further wherein the logic circuit electrically isolates the decode signal from the select circuit in response to the enable signal being in a low logic state.

14. An address column decode circuit, comprising:

a latch circuit;

a select circuit adapted to select a column of a memory array in response to a plurality of decode signals latched in the latch circuit; and a logic circuit interposed between the select circuit and the latch circuit, wherein the logic circuit has the enable signal as a first input and the plurality of decode signal as second inputs, further wherein the logic circuit electrically isolates the plurality of decode signals from the select circuit in response to the enable signal.

15. An address column decode circuit, comprising:

a latch circuit;

a select circuit adapted to select a column of a memory array in response to a plurality of decode signals latched in the latch circuit; and a plurality of AND logic gates interposed between the select circuit and the latch circuit, wherein each of the plurality of AND logic gates has one of the plurality of decode signals as a first input and an enable signal as a second input to electrically isolate the plurality of decode signals from the select circuit in response to the enable signal being in a low logic state.

* * * * *

UNITED STATES PATENT AND TRADEMARK OFFICE
CERTIFICATE OF CORRECTION

PATENT NO. : 6,246,632 B1
DATED : June 12, 2001
INVENTOR(S) : Mirmajid Seyyedy, Jeffrey P. Wright Page 1 of 1

It is certified that error appears in the above-identified patent and that said Letters Patent is hereby corrected as shown below:

Column 1,
Line 20, delete "F;".
Line 35, "pipeline." should read -- pipelined. --
Line 36, "lath" should read -- latch --.

Column 2,
Line 11, "isolating" should read -- isolates --.
Line 28, "isolating" should read -- isolates --.
Line 46, "signal;." should read -- signal. --.

Column 4,
Line 42, "Node B. The Enable" should read -- Node B, the Enable --.

Column 6, claim 8,
Line 57, "an decode" should read -- a decode --.

Signed and Sealed this

Fifteenth Day of January, 2002

Attest:

JAMES E. ROGAN
*Director of the United States Patent and Trademark Office*

*Attesting Officer*